United States Patent
Sooriyakumaran et al.

(10) Patent No.: US 7,622,240 B2
(45) Date of Patent: Nov. 24, 2009

(54) LOW BLUR MOLECULAR RESIST

(75) Inventors: Ratnam Sooriyakumaran, San Jose, CA (US); Hoa D. Truong, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 161 days.

(21) Appl. No.: 11/068,339

(22) Filed: Feb. 28, 2005

(65) Prior Publication Data

US 2006/0194144 A1    Aug. 31, 2006

(51) Int. Cl.
G03F 7/039 (2006.01)
G03F 7/004 (2006.01)
G03F 7/20 (2006.01)
G03F 7/30 (2006.01)
G03F 7/36 (2006.01)

(52) U.S. Cl. .............. 430/270.1; 430/313; 430/311; 430/326; 430/329; 430/905

(58) Field of Classification Search ................. None
See application file for complete search history.

(56) References Cited

U.S. PATENT DOCUMENTS

| 5,532,113 | A | 7/1996 | Frechet et al. ............ 430/296 |
| 5,648,196 | A | 7/1997 | Frechet et al. ........... 430/270.1 |
| 5,880,169 | A * | 3/1999 | Osawa et al. .............. 522/25 |
| 6,106,998 | A | 8/2000 | Maeda et al. ............ 430/280.1 |
| 6,146,806 | A | 11/2000 | Maeda et al. .............. 430/170 |
| 6,455,217 | B2 | 9/2002 | Tomita .................. 430/108.4 |
| 2001/0026898 | A1 | 10/2001 | Tomita .................. 430/108.4 |
| 2001/0026901 | A1 | 10/2001 | Maeda et al. ............ 430/270.1 |
| 2002/0086226 | A1 | 7/2002 | Maehara ................... 430/18 |
| 2003/0134225 | A1 | 7/2003 | Fujimori et al. ......... 430/270.1 |
| 2003/0224287 | A1 | 12/2003 | Fujimori ................ 430/270.1 |

FOREIGN PATENT DOCUMENTS

| JP | 5-165219 | * | 7/1993 |
| JP | 406175371 A | | 6/1994 |
| JP | 09001337458 A | | 12/2001 |

OTHER PUBLICATIONS

Yan et al (Chem. Abstract for "p-Methoxybenzyl Ethers as Acid-Labile Protecting Groups in Oligosaccharide Synthesis", Synlett (1995), p. 523-524.*
Kim et al ("Novle Molecular Resists Based on Inclusion Complex of Cyclodextrin", Proceedings of SPIE, vol. 4690 (2002), p. 837-845.*
Partial, machine-assisted English translation of JP 05-165219 (Urano et al), provided by JPO (Jul. 1993).*
Chem. Abstract 1994:641805 (English abstract for JP 5-165219 (Urano et al). (Jul. 1993).*
English abstract for JP 5-165219 (Urano et al), provided by JPO (Jul. 1993).*

* cited by examiner

*Primary Examiner*—Sin J. Lee
(74) *Attorney, Agent, or Firm*—Schmeiser, Olsen & Watts

(57) ABSTRACT

A molecular resist composition and method of use is disclosed wherein the composition includes no silicon containing material, no polymeric material, and a substituted oligosaccharide, wherein the substituted oligosaccharide is substituted with at least one acid-cleavable —OR group, wherein the substituted oligosaccharide has 2 to 10 monosaccharides, wherein the molecular resist may be initially insoluble in developer, which may be an aqueous alkaline solution or developer consisting essentially of water. In some embodiments, the molecular resist may become soluble in the developer consisting essentially of water upon exposure to radiation having a wavelength of 193 nm or less and a post-exposure bake temperature from about room temperature to about 110° C. The resist material of the present invention may be used to print feature sizes wherein developed images may have a line/spacing not greater than than 120 nm when the developer consists essentially of water or an aqueous alkaline solution.

25 Claims, 3 Drawing Sheets

LOW BLUR MOLECULAR RESIST

BACKGROUND OF THE INVENTION

1. Technical Field

This invention relates generally to photolithography and semiconductor formulation, and more specifically, to a non-polymeric, non-silicon containing molecular resist material and method of using the molecular resist for photolithographic imaging.

2. Background Art

Manufacturing of semiconductor devices is dependent upon the accurate replication of computer aided design (CAD) generated patterns onto the surface of a device substrate. The replication process is typically performed using lithographic processes followed by a variety of subtractive (etch) and additive (deposition) processes.

Photolithography, a type of lithographic process, is used in the manufacturing of semiconductor devices, integrated optics, and photomasks. The process basically comprises: applying a layer of a polymeric material containing a photoacid (PAG) that will react when exposed to light, known as a photoresist or, simply, a resist; selectively exposing portions of the resist to light or other ionizing radiation, i.e., ultraviolet, electron beams, extreme UV, X-rays, etc., thereby changing the solubility of portions of the material; and developing the resist by washing it with a developer solution, such as tetramethylammonium hydroxide (TMAH), thereby removing the non-irradiated (in a negative resist) or irradiated (in a positive resist) portions of the layer. A post-exposure bake may be employed to complete changing the solubility of portions of the material, before developing the exposed resist.

In a positive resist, the initially unexposed polymeric resist is insoluble in developer, while the exposed resist becomes more soluble as the exposure dose is increased above a threshold value. For a negative resist, similar behavior is observed, except that the initially unexposed polymeric resist is soluble in developer, and the exposed area is rendered insoluble. By means of this differential solubility between the exposed and unexposed resist areas, it is possible to form a pattern in the polymeric resist film. This pattern can be used to form integrated circuit devices, and is currently a critical component in their manufacture.

Despite the widespread use of polymeric resist materials, as the need for higher resolutions and minimum feature sizes increases, certain characteristics of polymeric resist materials may result in non-uniform pattern features. For example, the non-linear dissolution rates of some polymers, as well as the distribution of polymer chain lengths and chain entanglements, may lead to non-uniform feature dimensions and line edge roughness at very small feature sizes. In turn, such pattern variations may induce fluctuations in threshold voltages and line resistances, thereby degrading circuit performance.

Generally, high post-exposure bake temperatures (e.g., greater than 120° C.) are needed to change the solubility of portions of polymer containing resist material. As the need for higher and higher levels of integration has arisen in the industry, the need for higher resolution of the resist composition, i.e., a larger number of lines and spaces in a given area has increased dramatically. At high bake temperatures, acid-diffusion becomes pronounced which adversely affects the resolution of the images. Therefore, there is a need for a resist material, which when exposed undergoes a change in solubility at low post-exposure bake temperatures.

SUMMARY OF THE INVENTION

Accordingly, the present invention provides a resist composition comprising: a substituted oligosaccharide, wherein the substituted oligosaccharide is substituted with at least one acid-cleavable —OR group and the substituted oligosaccharide has 2 to 10 monosaccharides, wherein each monosaccharide in the substituted oligosaccharide has at least three carbon atoms and the monosaccharides are joined by glycosidic linkages. The at least one remaining hydroxyl group from a monosaccharide of said substituted oligosaccharide has been replaced by a protective group having the acid-cleavable —OR group selected from the group consisting of ester, —OXC(O)OR$_{37}$, ether, —OR$_{38}$, carbonate, —OC(O)OR$_{39}$, acetal, —O—C(OR$_{40}$)R$_{41}$H, ketal, —O—C(OR$_{42}$)R$_{43}$R$_{44}$, orthoester, —OC(OR$_{45}$)(OR$_{46}$)R$_{47}$, and combinations thereof, wherein each X is a linking group selected from the group consisting of linear or branched alkylene having 1 to 7 carbon atoms, cycloalkylene having 3 to 17 carbon atoms, alkylcycloalkylene having 4 to 20 carbon atoms, a cycloalkylalkylene having 4 to 20 carbon atoms, and combinations thereof, wherein each of R$_{37}$, R$_{38}$, and R$_{39}$ (R$_{37}$-R$_{39}$) is selected from the group consisting of hydrocarbyl substituents with a tertiary carbon attachment point, wherein R$_{39}$ is not a t-butyl group, and wherein each of R$_{40}$, R$_{41}$, R$_{42}$, ... R$_{46}$, R$_{47}$ (R$_{40}$-R$_{47}$) is independently selected from the group of hydrocarbyl substituents with a primary, secondary or tertiary carbon attachment point consisting of a linear alkyl group having 1-6 carbon atoms, a branched alkyl group having 2-12 carbon atoms, a cycloalkyl group having 3-17 carbon atoms, a fluorinated linear alkyl group having 2-12 carbon atoms, a fluorinated branched alkyl group having 2-12 carbon atoms, and a fluorinated cycloalkyl group having 3-17 carbon atoms, aryl groups, aralkyl groups, alkaryl groups, cycloalkyl groups, bicycloalkyl groups, alkenyl groups, alkalkenyl groups, and alkenylalkyl groups, alkynyl groups, alkalkynyl groups, alkynylalkyl groups, trifluoropropyl groups, cyanopropyl groups, acryloyl groups, arylacryloyl groups, acryloylaryl groups, alkylacyl groups, arylacyl groups alkylenylacyl groups and alkynylacyl groups, and furthermore wherein R$_{41}$ and/or R$_{47}$ may be a hydrogen atom, and wherein any two R$_{40}$-R$_{47}$ in the same molecule may be linked to form a three- to eight-membered cyclic group.

A second aspect of the present invention provides a resist, comprising: a composition that includes a substituted oligosaccharide, wherein the substituted oligosaccharide is substituted with at least one acid-cleavable —OR group, wherein the substituted oligosaccharide has 2 to 10 monosaccharides, wherein the resist is initially insoluble in a developer consisting essentially of water but becomes soluble in the developer upon exposure to imaging radiation and a post-exposure bake temperature from about room (ambient) temperature to about 110° C. The resist may advantageously include no silicon containing material and no polymeric material.

A third aspect of the present invention provides a method of forming a pattern over a substrate, said method comprising: (A) applying a positive resist composition over the substrate to form a resist layer, wherein the resist composition is insoluble in a developer solution before exposure to the imaging radiation, and is soluble in the developer solution after exposure to the imaging radiation, said resist composition comprising: i) a radiation sensitive acid generator; and ii) a resist composition comprising: a substituted oligosaccharide, wherein the substituted oligosaccharide is substituted with at least one acid-cleavable —OR group, wherein the substituted oligosaccharide has 2 to 10 monosaccharides, wherein each monosaccharide in the substituted oligosaccharide has at least three carbon atoms, wherein the monosaccharides are joined by glycosidic linkages, and wherein at least one remaining hydroxyl group from a monosaccharide of said substituted oligosaccharide has been replaced by a protective group having the acid-cleavable —OR group selected from the group consisting of ester, —OXC(O)OR$_{37}$, ether, —OR$_{38}$, carbonate, —OC(O)OR$_{39}$, acetal, —O—C(OR$_{40}$)R$_{41}$H, ketal, —O—C(OR$_{42}$)R$_{43}$R$_{44}$, orthoester, —OC(OR$_{45}$)(OR$_{46}$)R$_{47}$, and combinations thereof, wherein X is a linking group selected from the group consisting of linear or branched alkylene having 1 to 7 carbon atoms, cycloalkylene having 3 to 17 carbon atoms, alkylcycloalkylene having 4 to 20 carbon atoms, a cycloalkylalkylene having 4 to 20 carbon atoms, and combinations thereof, wherein each R$_{37}$-R$_{39}$ is selected from the group consisting of hydrocarbyl substituents with a tertiary carbon attachment point, wherein R$_{39}$ is not a t-butyl group, and wherein each of R$_{40}$-R$_{47}$ is independently selected from the group of hydrocarbyl substituents with a primary, secondary or tertiary carbon attachment point consisting of a linear alkyl group having 1-6 carbon atoms, a branched alkyl group having 2-12 carbon atoms, a cycloalkyl group having 3-17 carbon atoms, a fluorinated linear alkyl group having 2-12 carbon atoms, a fluorinated branched alkyl group having 2-12 carbon atoms, and a fluorinated cycloalkyl group having 3-17 carbon atoms, aryl groups, aralkyl groups, alkaryl groups, cycloalkyl groups, bicycloalkyl groups, alkenyl groups, alkalkenyl groups, and alkenylalkyl groups, alkynyl groups, alkalkynyl groups, alkynylalkyl groups, trifluoropropyl groups, cyanopropyl groups, acryloyl groups, arylacryloyl groups, acryloylaryl groups, alkylacyl groups, arylacyl groups alkylenylacyl groups and alkynylacyl groups, and furthermore wherein R$_{41}$ and R$_{47}$ may be a hydrogen atom, and wherein any two R$_{40}$-R$_{47}$ in the same molecule may be linked to form a three- to eight-membered cyclic group;

(B) selectively exposing a first portion of the resist layer to imaging radiation in order that a second portion of the resist layer is not exposed to the radiation, wherein the first and second portions of the resist layer form a latent pattern in the resist layer, wherein the radiation causes an acid generator to generate acid in the first portion of the resist layer, wherein the acid facilitates removal of the acid-cleavable —OR groups so as to generate a reaction product in the first portion of the resist layer, and wherein the reaction product is soluble in the developer; and (C) developing away the first portion of the resist layer by contacting the resist layer with the developer so that the first portion of the resist layer is replaced by voids in the resist layer.

The foregoing and other features and advantages of the invention will be apparent from the following more particular description of preferred embodiments of the invention.

BRIEF DESCRIPTION OF THE DRAWINGS

The preferred exemplary embodiments of the present invention will hereinafter be described in conjunction with the appended drawings, where like designations denote like elements.

DETAILED DESCRIPTION OF THE INVENTION

Figure 1:
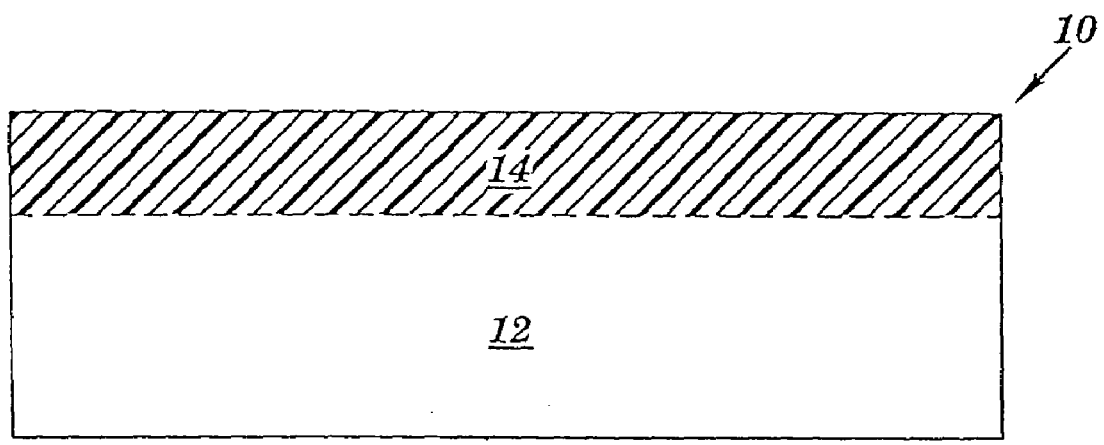
FIGS. 1-6 illustrate the use of photolithography with a resist to pattern a substrate, in accordance with embodiments of the present invention.

The non-silicon containing, non-polymer containing resist composition of embodiments of the present invention include substituted oligosaccharides, wherein the substituted oligosaccharide is substituted with at least one low activation energy, acid-cleavable —OR group to achieve higher resolution photolithography. The molecular resists may give higher resolution and lower line edge roughness (LER) than polymeric resists because of their smaller size and uniform properties. Since molecular resists may be characterized by low glass transition temperatures (Tg), processing temperatures above the Tg, which may be needed to deprotect the resist when high-activation energy protecting groups have been used, may degrade the image quality. Furthermore, when low-activation energy protecting groups are used to protect molecular resists, higher image quality may result because acid diffusion may be reduced. Therefore, applying a low-blur resist design to molecular resists should result in high resolution resists.

In principle, the use of nonpolymeric materials as molecular resists represents a potentially useful approach for avoiding the problems associated with polymeric materials. Since resists derived from single molecules would not contain mixtures of polymer chains of varying lengths, the dissolution characteristics and properties should be uniform. In addition, higher resolutions and decreased line edge roughness may be possible since single molecules have much smaller sizes and would not suffer from molecular chain entanglement.

The present invention discloses molecular resist compositions that include no silicon containing material, no polymeric material, and a substituted oligosaccharide, wherein the substituted oligosaccharide is substituted with at least one acid-cleavable —OR group, wherein the substituted oligosaccharide has 2 to 10 monosaccharides, wherein each monosaccharide in the substituted oligosaccharide has at least three carbon atoms, wherein the monosaccharide units are joined by glycosidic linkages, wherein the molecular resist is initially insoluble in basic developer, such as tetramethyl ammonium hydroxide (TMAH), or in developer consisting essentially of water, but becomes soluble in basic developer, such as tetramethyl ammonium hydroxide (TMAH), or in the developer consisting essentially of water upon exposure to imaging radiation and a post-exposure bake temperature from about room (ambient) temperature to about 110° C.

The non-polymeric, non-silicon containing molecular resist compositions of the present invention are generally capable of providing good spatial resolution in lithographic patterns. Developed images may have a line spacing no greater than 120 nm when the developer consists essentially of aqueous alkaline solutions or of water when the developed molecular resist composition has been exposed to imaging radiation characterized by a wavelength of 193 nm or less (e.g., 157 nm or extreme ultraviolet (EUV), 13.5 nm) or e-beam radiation, characterized by an energy from about 3 MeV to about 12 MeV (million electron volts).

The present invention further discloses a method of forming a pattern over a substrate (e.g., a semiconductor wafer) though use of said non-polymeric, non-silicon containing molecular resist composition. The molecular resist compositions generally comprise: i) a radiation sensitive acid generator; ii) a substituted oligosaccharide, wherein the substituted oligosaccharide may be substituted with at least one acid-cleavable OR group, wherein the substituted oligosaccharide has 2 to 10 monosaccharides, wherein each monosaccharide in the substituted oligosaccharide has at least three carbon atoms, wherein the monosaccharides are joined by glycosidic linkages, and wherein an at least one remaining hydroxyl group from a monosaccharide of said substituted oligosaccharide has been replaced by a protective group having the acid-cleavable —OR group selected from the group consisting of ester, —OXC(O)OR$_{37}$, ether, —OR$_{38}$, carbonate, —OC(O)OR$_{39}$, acetal, —O—C(OR$_{40}$)R$_{41}$H, ketal, —O—C(OR$_{42}$)R$_{43}$R$_{44}$, orthoester, —OC(OR$_{45}$)(OR$_{46}$)R$_{47}$, and combinations thereof, wherein each X is a linking group selected from the group consisting of linear or branched alkylene having 1 to 7 carbon atoms, cycloalkylene having 3 to 17 carbon atoms, alkylcycloalkylene having 4 to 20 carbon atoms, a cycloalkylalkylene having 4 to 20 carbon atoms, and combinations thereof, wherein each R$_{37}$-R$_{39}$ is selected from the group consisting of hydrocarbyl substituents with a tertiary carbon attachment point, wherein R$_{39}$ is not a t-butyl group, and wherein R$_{40}$-R$_{47}$ are each independently selected from the group consisting of hydrogen, a linear alkyl group having 1-6 carbon atoms, a branched alkyl group having 2-12 carbon atoms, a cycloalkyl group having 3-17 carbon atoms, a fluorinated linear alkyl group having 2-12 carbon atoms, a fluorinated branched alkyl group having 2-12 carbon atoms, and a fluorinated cycloalkyl group having 3-17 carbon atoms, aryl groups, aralkyl groups, alkaryl groups, cycloalkyl groups, bicycloalkyl groups, alkenyl groups, alkalkenyl groups, and alkenylalkyl groups, alkynyl groups, alkalkynyl groups, alkynylalkyl groups, trifluoropropyl groups, cyanopropyl groups, acryloyl groups, arylacryloyl groups, acryloylaryl groups, alkylacyl groups, arylacyl groups alkylenylacyl groups and alkynylacyl groups, and wherein any two R$_{40}$-R$_{47}$ in the same molecule may be linked to form a three- to eight-membered cyclic group. The acid-cleavable —OR group may include

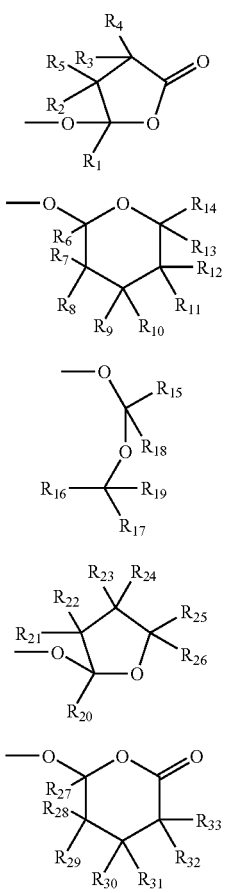

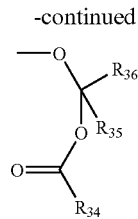

wherein R$_1$, R$_2$, . . . R$_{36}$ (R$_1$-R$_{36}$) are independently selected from the groups consisting of hydrogen, a linear alkyl group having 1-6 carbon atoms, a branched alkyl group having 2-12 carbon atoms, a cycloalkyl group having 3-17 carbon atoms, a fluorinated linear alkyl group having 2-12 carbon atoms, a fluorinated branched alkyl group having 2-12 carbon atoms, and a fluorinated cycloalkyl group having 3-17 carbon atoms.

In some embodiments, R$_1$-R$_{36}$ are independently selected from the groups consisting of aryl groups, aralkyl groups, alkaryl groups, cycloalkyl groups, alkylcycloalkyl, cycloalkylalkyl, bicycloalkyl groups, alkenyl groups, alkalkenyl groups, and alkenylalkyl groups, alkynyl groups, alkalkynyl groups, alkynylalkyl groups, trifluoropropyl groups, cyanopropyl groups, acryloyl groups, arylacryloyl groups, acryloylaryl groups, alkylacyl groups, arylacyl groups alkylenylacyl groups and alkynylacyl groups, and wherein any two of R$_1$-R$_{36}$ that are in the same molecule may be linked to form a three- to eight-membered cyclic group.

Non-limiting examples of acid-cleavable —OR groups are normal or branched chain acetal groups such as 1-ethoxyethyl, 1-propoxyethyl, 1-n-butoxyethyl, 1-isobutoxy-ethyl, 1-t-butyloxyethyl, and 1-t-amyloxyethyl groups; and cyclic acetal groups such as tetrahydrofuranyl, tetrahydropyranyl, and 2-methoxytetrahydro-pyranyl groups.

The following structures (IX to XI) are additional non-limiting examples of the acid-cleavable —OR groups which may be used in the molecular resist composition of the present invention:

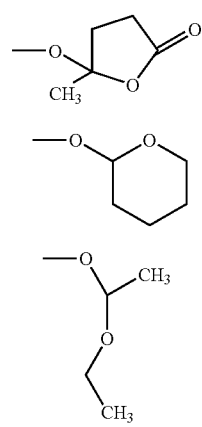

In some embodiments, the monosaccharides are each selected from the group consisting of pentoses, hexoses and combinations thereof.

In some embodiments, the monosaccharides have the same number of carbon atoms, and the number of carbon atoms in each monosaccharide is three or more.

In some embodiments, the substituted oligosaccharide is substituted with at least one acid-cleavable —OR group, has 2 to 10 monosaccharides, and may be represented by the following cyclic Formula VII, wherein carbon atoms C1, C2, C3, ... C6 of one monosaccharide have been designated 1, 2, 3, ... 6, and the carbon atoms C1', C2', C3' ... C6' of the other monosaccharide have been designated 1', 2', 3' ... 6' in accordance with the IUPAC numbering system for numbering the carbon atoms of the parent chain, and wherein n is a positive integer from 1 to 9:

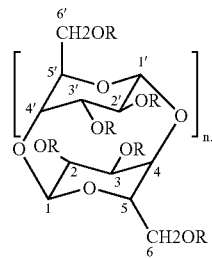

VII

Formula VII, supra, represents all stereoisomers and racemates of the cyclic substituted oligosaccharide having the acid-cleavable —OR group. In Formula VII, supra, the monosaccharide units are joined by glycosidic linkages. It should be noted that the glycosidic linkages may be formed between C1 of one of the monosaccharides and any one of the C2', C3', C4', and C6' of the other monosaccharide. Formula VIIB, infra, depicts an isomer of Formula VII, supra, wherein n=2, in which the glycosidic linkage has been formed between C6 of a first monosaccharide and C1' of a second monosaccharide. Again, a glycosidic linkage is formed between C1 of the first monosaccharide and C4' of the second monosaccharide.

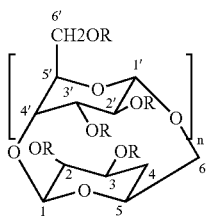

VIIB

Alternatively, in some embodiments, the substituted oligosaccharide, wherein the substituted oligosaccharide is substituted with at least one acid-cleavable —OR group, wherein the substituted oligosaccharide has 2 to 10 monosaccharides, may be represented by the following linear Formula VIII, wherein m is a positive integer from 2 to 10:

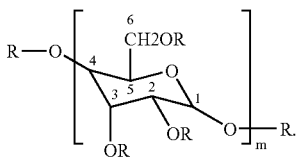

VIII

Formula VIII, supra, represents all stereoisomers and racemates of a linear substituted oligosaccharide wherein the substituted oligosaccharide is substituted with at least one acid-cleavable —OR group, and wherein the substituted oligosaccharide has 2 to 10 monosaccharides. In Formula VIII, supra, the monosaccharide units are joined by glycosidic linkages. It should be noted that the glycosidic linkages may be formed between C1 of the monosaccharide represented by Formula VIII, supra, and one of the C2, C3, C4, and C6 carbon atoms of the other monosaccharide. Formula VIIIB, infra, depicts an isomer of Formula VIII, supra, wherein m=2, in which the glycosidic linkage has been formed between C1 of a first monosaccharide and C6' of a second monosaccharide.

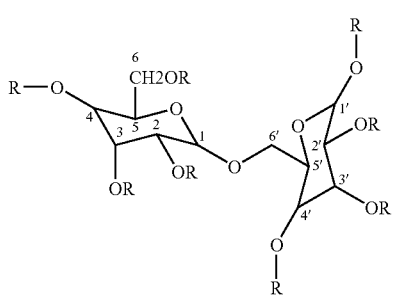

VIIIB

The substituted oligosaccharides, wherein the substituted oligosaccharide is substituted with at least one acid-cleavable —OR group, have between 2 and 10 monosaccharides. In some embodiments, the between 2 and 10 monosaccharides may be a cyclic substituted oligosaccharide (eg. β-cyclodextrin, Formula VIIA, infra) or a linear substituted oligosacchride (eg. D-Cellobiose, Formula VIIIA, infra).

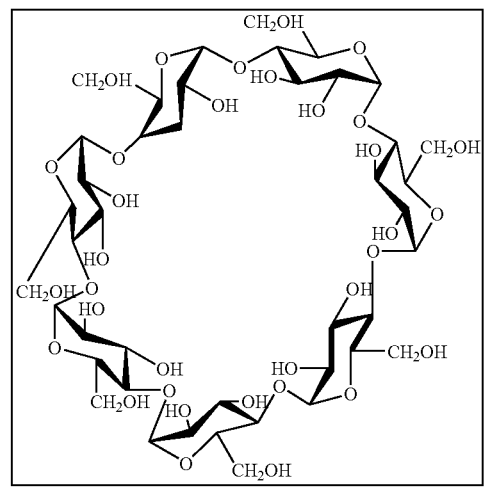

VIIA

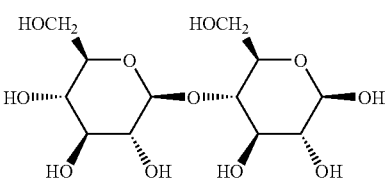

VIIIA

Alternatively, the between 2 and 10 monosaccharides may be between 2 and 10 ketoses or aldoses having at least 3 carbon atoms. In some embodiments, the between 2 and 10 monosaccharides may be between 2 and 10 furanoses, pentoses or hexoses. The development of low-blur molecular resists are based on substituted oligosaccharides with defined molecular weights. The substituted oligosaccharides may be carbohydrates that may be hydrolyzed to give monosaccharide molecules. Monosaccharides may not be further hydrolyzed and they may contain an aldehyde group (aldose) or keto group (ketose). Depending on the number of carbon atoms, monosaccharides may be known as triose (3 carbons), tetrose (4 carbons), pentose (5 carbons), hexose (6 carbons) and so on. Most of the naturally occurring monosaccharides may be pentoses and hexoses. A hexose with an aldehyde group may be called aldohexose. Similarly, a pentose with keto group may be called a ketopentose.

The oligosaccharides such as VIIA and VIIIA, supra, may be attractive starting materials for molecular resist development because they are commercially available, inexpensive, and biodegradable. Reactions 1 and 2, infra, illustrate an embodiment of a resist design. Reaction 1, infra, depicts formation of the protected oligosaccharide VIII having the acid-cleavable —OR groups. In reaction 1, a hydroxyl group of an oligosaccharide represented by formula IXA has been replaced by an acid-cleavable —OR group, using an acid catalyzed synthesis described in Examples 1-3, infra. The acid may be any appropriate acid for catalyzing ether formation, such as toluene sulfonic acid, as in Examples, 1-3, infra.

Reaction 1: Formulation of Protected Oligosaccharide VIII

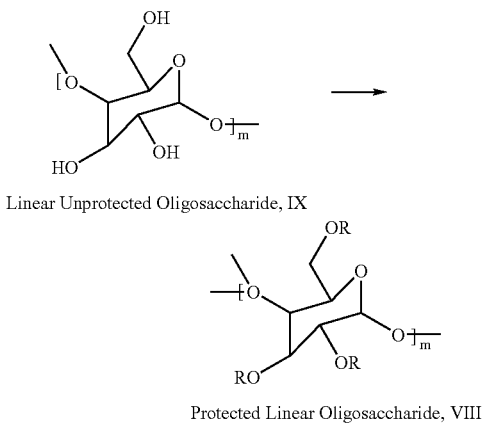

Linear Unprotected Oligosaccharide, IX

Protected Linear Oligosaccharide, VIII

In Reaction 2, the alcohol groups of the between 2 and 10 monosaccharides may be easily deprotected, as in Examples 5 and 6, infra, because the deprotection has a low activation energy. Said low activation energy results because the acid-cleavable —OR groups may be easily deprotected in the presence of acid produced by exposure of the substituted oligosaccharide, wherein the substituted oligosaccharide is substituted with at least one acid-cleavable —OR group, wherein the substituted oligosaccharide has 2 to 10 monosaccharides, to imaging radiation and post-exposure baking at temperatures from about room temperature to about 110° C., as in Examples, 5 and 6, infra. In some embodiments, each of said easily acid-cleavable —OR group is selected from the group consisting of ester, —OXC(O)OR$_{37}$, ether, —OR$_{38}$, carbonate, —OC(O)OR$_{39}$, acetal, —O—C(OR$_{40}$)R$_{41}$H, ketal, —O—C(OR$_{42}$)R$_{43}$R$_{44}$, orthoester, —OC(OR$_{45}$)(OR$_{46}$)R$_{47}$, and combinations thereof, wherein each X is a linking group selected from the group consisting of linear or branched alkylene having 1 to 7 carbon atoms, cycloalkylene having 3 to 17 carbon atoms, alkylcycloalkylene having 4 to 20 carbon atoms, a cycloalkylalkylene having 4 to 20 carbon atoms, and combinations thereof, wherein each $R_{37}$-$R_{39}$ is selected from the group consisting of hydrocarbyl substituents with a tertiary carbon attachment point, wherein $R_{39}$ is not a t-butyl group, and wherein either one of $R_{40}$-$R_{47}$ is hydrogen or each of $R_{40}$-$R_{47}$ is independently selected from the group of hydrocarbyl substituents with a primary, secondary or tertiary carbon attachment point consisting of a linear alkyl group having 1-6 carbon atoms, a branched alkyl group having 2-12 carbon atoms, a cycloalkyl group having 3-17 carbon atoms, a fluorinated linear alkyl group having 2-12 carbon atoms, a fluorinated branched alkyl group having 2-12 carbon atoms, and a fluorinated cycloalkyl group having 3-17 carbon atoms, aryl groups, aralkyl groups, alkaryl groups, cycloalkyl groups, bicycloalkyl groups, alkenyl groups, alkalkenyl groups, and alkenylalkyl groups, alkynyl groups, alkalkynyl groups, alkynylalkyl groups, trifluoropropyl groups, cyanopropyl groups, acryloyl groups, arylacryloyl groups, acryloylaryl groups, alkylacyl groups, arylacyl groups alkylenylacyl groups and alkynylacyl groups, and wherein any two $R_{40}$-$R_{47}$ in the same molecule may be linked to form a three- to eight-membered cyclic group. It has been found that the protecting groups in the substituted oligosaccharides may be easily deprotected and that said deprotection has a low activation energy because the alcohol groups of the oligosaccharides may be easily restored by post-exposure baking from about room temperature to about 110° C., as depicted by reaction 2, infra, and exemplified by Examples 5-6, infra.

Reaction 2: Deprotecting Oligosaccharide IX, A Proposed mechanism For Solubility Change

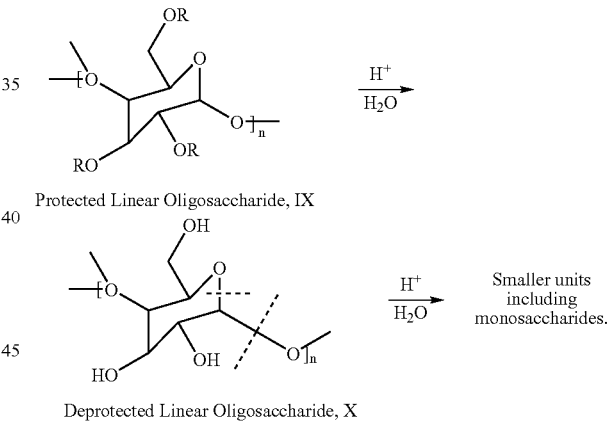

Protected Linear Oligosaccharide, IX

Deprotected Linear Oligosaccharide, X

Unlike the unprotected oligosaccharides represented by Formula X, supra, having the between 2 and 10 monosaccharides, the substituted oligosaccharides are readily soluble in most organic solvents. When formulated with photoacid generators (PAGs), the substituted oligosaccharides having the at least one acid-cleavable —OR group act as positive resists. On exposure and post-exposure bake, the exposed area may become soluble in aqueous base developer and may also become soluble in developer consisting essentially of water. Reaction 2, supra, illustrates a proposed mechanism for this solubility change in which the acid-cleavable —OR protecting groups are deprotected in the presence of photoacid and simultaneously the substituted oligosaccharide molecules, which are linked together via glycosidic links, break down into smaller (possibly monosaccharide) units. This leads to the dissolution of the exposed area in the aqueous base developer or in water, when water is the developer. The water development is an attractive novel attribute of these nonpolymeric resist materials. Furthermore, developed images having line/spacing no greater than 120 nm have been demonstrated when the developer consists essentially of water, which has not been possible in polymeric resists.

In the embodiments represented by Formulas VII and VIIA, 7 monosaccharides having 6 carbon atoms have been linked by glycosidic linkages. In the embodiments represented by Formulas VIII and VIIIA, 2 monosaccharides having 6 carbon atoms have been linked by glycosidic linkages. In Formulas VII, VIIA, VIII, and VIIIA, the glycosidic linkages have been formed between C4 of a first monosaccharide and a C1 of another monosaccharide of the substituted oligosaccharide. Alternatively, glycosidic linkages may be formed between C2, C3, or C6 of the first monosaccharide and a C1 of another monosaccharide.

The term alkyl groups designates both normal alkyl and branched alkyl groups. Included among normal and branched alkyl groups are those having between about 1 and about 22 carbon atoms. Normal alkyl and branched alkyl groups include, inter alia: methyl, ethyl, propyl, isopropyl, butyl, tertiary-butyl, pentyl, neopentyl, hexyl, octyl, decyl, dodecyl groups. Aryl groups include, inter alia, phenyl, anthryl and phenanthryl groups. Included among aralkyl groups are those having between about 7 and about 14 carbon atoms. Aralkyl groups include, inter alia: benzyl, phenylbutyl, phenylpropyl, phenylethyl and phenylallyl groups. Alkaryl groups include, inter alia, tolyl and cumyl groups. Cycloalkyl or bicycloalkyl groups each include between about 3 and about 12 ring carbon atoms, and no greater than about 50 carbon atoms totally. Cycloalkyl groups include, inter alia: cyclobutyl, cyclopentyl, cyclohexyl, methylcyclohexyl, and cycloheptyl groups. Bicycloalkyl groups include, inter alia: norbornyl.

Alkenyl groups include, inter alia: ethenyl, butenyl and propargyl groups. Alkenylalkyl groups include inter alia: allyl groups. Alkylalkenyl groups include inter alia: 4-methyl-3-butenyl. Alkenylphenyl groups include inter alia: vinylphenyl groups. Arylalkenyl groups include inter alia: styryl groups. Alkynyl groups include inter alia: ethynyl groups. Alkynylalkyl groups include inter alia: propargyl groups. Alkylalkynyl groups include inter alia: 4-methyl-3-butynyl groups. Acryloyl groups include inter alia: acryloyl and methacryloyl groups. Arylacryloyl groups include inter alia: phenylacryloyl groups. Acryloylaryl groups include inter alia: acryloylphenyl and methacryloylphenyl groups. Acyl and Alkylacyl groups include inter alia: formyl, acetyl, propanoyl, butanoyl, pentanoyl, hexanoyl, heptanoyl, octanoyl, isopropanoyl, isobutanoyl, isopentanoyl, neopentanoyl, 2-methylpentanoyl, 3-methylpentanoyl, 2-methylhexanoyl, 3-methylhexanoyl, t-butanoyl. Arylacyl groups include inter alia: phenylacetyl, anthrylacetyl, phenanthrylacetyl. Alkenylacyl groups include inter alia: acryloyl and methacryloy. Alkynylacyl groups include inter alia: propynoyl, butynoyl, pentynoyl and hexynoyl.

Upon exposure of the molecular resist composition to an imaging radiation characterized by a wavelength, an acid is generated by the acid generator. Prior to the exposure of the molecular resist to the imaging radiation, the resist polymer may be insoluble in an aqueous alkaline developer solution or water. The generated acid facilitates a chemical reaction between the oligomeric saccharide having the acid-cleavable —OR group, wherein the substituted oligosaccharide has 2 to 10 monosaccharides, wherein each monosaccharide in the substituted oligosaccharide has at least three carbon atoms, wherein the monosaccharides are joined by glycosidic linkages, and wherein a hydroxyl group of at least one remaining hydroxyl group from a monosaccharide of said substituted oligosaccharide has been replaced by the at least one acid-cleavable —OR group, wherein the R groups are selected from the groups consisting of acid-cleavable ester, acid-cleavable oligomeric ester, acid-cleavable ether, acid-cleavable carbonate, acid-cleavable acetal, acid-cleavable ketal, and acid-cleavable orthoester and combinations thereof, and wherein the acid-cleavable —OR group is not t-butylcarbonate, to generate a reaction product that may be soluble in the developer solution.

The molecular resist of the present invention may be positive acting and will not be subject to so called resolution "blur" as chemistry for removing the acid-cleavable —OR groups occurs at significantly lower temperatures in these materials, from about room (ambient) temperature to about 110° C., in order that the processing temperature can be lower and hence one could avoid the effect of photoacid diffusion (low-blur resist design). Photoacid diffusion is deleterious because diffusion of the photoacid into unexposed portions of a resist results in removal of the acid-cleavable —OR groups in the unexposed portion of the resist. Removal of the acid-cleavable —OR groups in the unexposed portion of the resist may result in resolution "blur" because removal of the acid-cleavable —OR groups in the unexposed portion of the resist results in developing these unexposed portions during the developing step of the photolitographic process. Accordingly, since chemistry for removing the acid-cleavable —OR groups occurs at significantly lower temperatures, in order that the effect of photoacid diffusion may be avoided, the molecular resists of the present invention provide good spatial resolution in photolithographic applications with imaging radiation wavelengths of 193 nm or less (e.g., 157 nm). Developed images may have a line spacing no greater than 120 nm when the developer consists essentially of aqueous alkaline solutions or of water when the developed molecular resist composition may have been exposed to imaging radiation characterized by a wavelength of 193 nm or less (e.g., 157 nm or EUV, 13.5 nm) or e-beam radiation, characterized by an energy from about 3 MeV to about 12 MeV (million electron volts). The molecular resist of the present invention also provides good spatial resolution in photolithographic applications with imaging radiation wavelengths exceeding 193 nm (e.g., 248 nm).

In various exemplary embodiments, radiation sensitive acid generators, also known as photoacid generators, may be used in the molecular resist composition of the invention. These photoacid generators are compounds that generate an acid upon exposure to radiation. In various exemplary embodiments, any suitable photoacid generating agent may be used, so long as a mixture of the aforementioned molecular resist composition of the present invention and the selected photoacid generator dissolve sufficiently in an organic solvent and the resulting solution thereof forms a uniform film by a film-forming process, such as spin coating or the like. As will be evident to those skilled in the art, the following illustrative classes of photoacid generators may be employed in various exemplary embodiments of the present invention: Any PAG(s) incorporated into the present molecular resists should preferably have high thermal stability, i.e., stable to at least 140° C., so they are not degraded during pre-exposure processing.

Any one or more of a number of suitable photoacid generators can be used in the molecular resist compositions of the invention. Typical photoacid generators include, without limitation: (1) sulfonium salts, such as triphenylsulfonium perfluoromethanesulfonate (triphenylsulfonium triflate), triphenylsulfonium perfluorobutanesulfonate, triphenylsulfonium perfluoropentanesulfonate, triphenylsulfonium perfluorooctanesulfonate, triphenylsulfonium hexafluoroantimonate, triphenylsulfonium hexafluoroarsenate, triphenylsulfonium hexafluorophosphate, triphenylsulfonium bromide, triphenylsulfonium chloride, triphenylsulfonium iodide, 2,4,6-trimethylphenyldiphenylsulfonium perfluorobutanesulfonate, 2,4,6-trimethylphenyldiphenylsulfonium benzenesulfonate, tris(t-butylphenyl)sulfonium perfluorooctane sulfonate, diphenylethylsulfonium chloride, and phenacyldimethylsulfonium chloride;

(2) halonium salts, particularly iodonium salts, including diphenyliodonium perfluoromethanesulfonate (diphenyliodonium triflate), diphenyliodonium perfluorobutanesulfonate, diphenyliodonium perfluoropentanesulfonate, diphenyliodonium perfluorooctanesulfonate, diphenyliodonium hexafluoroantimonate, diphenyliodonium hexafluoroarsenate, diphenyliodonium bis-(t-butylphenyl)iodonium triflate, and bis-(di-t-butylphenyl)-iodonium camphanylsulfonate;

(3) α,α'-bis-sulfonyl-diazomethanes such as bis(p-toluenesulfonyl)diazomethane, methylsulfonyl p-toluenesulfonyldiazomethane, 1-cyclohexylsulfonyl-1-(1,1-dimethylethylsulfonyl) diazomethane, and bis(cyclohexylsulfonyl) diazomethane;

(4) trifluoromethanesulfonate esters of imides and hydroxyimides, e.g., α-(trifluoromethylsulfonyloxy)-bicyclo [2.2.1]hept-5-ene-2,3-dicarboximide (MDT);

(5) nitrobenzyl sulfonate esters such as 2-nitrobenzyl p-toluenesulfonate, 2,6-dinitrobenzyl p-toluenesulfonate, and 2,4-dinitrobenzyl p-trifluoromethylbenzene sulfonate;

(6) sulfonyloxynaphthalimides such as N-camphorsulfonyloxynaphthalimide and N-pentafluorophenylsulfonyloxynaphthalimide;

(7) pyrogallol derivatives (e.g., trimesylate of pyrogallol);
(8) naphthoquinone-4-diazides;
(9) alkyl disulfones;
(10) s-triazine derivatives; and

(10) miscellaneous sulfonic acid generators including t-butylphenyl-α-(p-toluenesulfonyloxy)-acetate, t-butyl-α-(p-toluenesulfonyloxy)acetate, and N-hydroxy-naphthalimide dodecane sulfonate (DDSN), and benzoin tosylate. To minimize acid diffusion for high resolution capability, the photoacid generators may generate bulky acids upon exposure to radiation. Such bulky acids may include at least 4 carbon atoms.

A preferred photoacid generator that may be employed in the present invention is an onium salt, such as an iodonium salt or a sulfonium salt, and/or a succinimide derivative. In various exemplary embodiments of the present invention, examples of the preferred photoacid generator structures for the present invention include, inter alia, at least one of: 4-(1-butoxynaphthyl)tetrahydrothiophenium perfluorobutanesulfonate, triphenyl sulfonium perfluorobutanesulfonate, t-butylphenyl diphenyl sulfonium perfluorobutanesulfonate, 4-(1-butoxynaphthyl)tetrahydrothiophenium perfluorooctanesulfonate, triphenyl sulfonium perfluorooctanesulfonate, t-butylphenyl diphenyl sulfonium perfluorooctanesulfonate, di(t-butylphenyl)iodonium perfluorobutane sulfonate, di(t-butylphenyl)iodonium perfluorohexane sulfonate, di(t-butylphenyl)iodonium perfluoroethylcyclohexane sulfonate, di(t-butylphenyl)iodonium camphoresulfonate, and perfluorobutylsulfonyloxybicylo[2.2.1]-hept-5-ene-2,3-dicarboximide. Any of the preceding photoacid generators may be used singly or in a mixture of two or more.

The specific photoacid generator selected will depend on the irradiation being used for patterning the molecular resist. Photoacid generators are currently available for a variety of different wavelengths of light from the visible range to the X-ray range; thus, imaging of the molecular resist can be performed using deep-UV, extreme-UV, e-beam, laser, or any other selected irradiation source that is deemed useful.

The quencher that may be used in the molecular resist composition of the invention may comprise a weak base that scavenges trace acids, while not having an excessive impact on the performance of the positive molecular resist. Illustrative examples of such quenchers may include aromatic or aliphatic amines, such as 2-phenylbenzimidazole, or tetraalkyl ammonium hydroxides, such as tetrabutyl ammonium hydroxide (TBAH).

The remainder of the resist composition is composed of a solvent and may additionally, if necessary or desirable, include customary additives such as dyes, sensitizers, additives used as stabilizers and acid-diffusion controlling agents, coating aids such as surfactants or anti-foaming agents, adhesion promoters and plasticizers.

The choice of solvent is governed by many factors not limited to the solubility and miscibility of resist components, the coating process, and safety and environmental regulations. Additionally, inertness to other resist components is desirable. It is also desirable that the solvent possess the appropriate volatility to allow uniform coating of films yet also allow significant reduction or complete removal of residual solvent during the post-application bake process. Solvents well known to those skilled in the art may be employed in the molecular resist composition of various exemplary embodiments of the present invention. Such solvents may be used to dissolve the resist polymer, the additive, and other components of the molecular resist composition. Illustrative examples of such solvents may include, but are not limited to: ethers, glycol ethers, aromatic hydrocarbons, ketones, esters and the like. Preferred solvents may include propylene glycol monomethyl ether acetate, ethyl lactate, γ-butyrolactone, and cyclohexanone. Any of these solvents may be used singly or in a mixture of two or more.

In addition to the above components, the molecular resist compositions provided herein generally include a casting solvent to dissolve the other components so that the overall composition may be applied evenly on the substrate surface to provide a defect-free coating. Where the molecular resist composition is used in a multilayer imaging process, the solvent used in the imaging layer molecular resist is preferably not a solvent to the underlayer materials, otherwise unwanted intermixing may occur. The invention is not limited to selection of any particular solvent. Suitable casting solvents may generally be chosen from ether-, ester-, hydroxyl-, and ketone-containing compounds, or mixtures of these compounds. Examples of appropriate solvents include carbon dioxide, cyclopentanone, cyclohexanone, ethyl 3-ethoxypropionate (EEP), a combination of EEP and γ-butyrolactone (GBL), lactate esters such as ethyl lactate, alkylene glycol alkyl ether esters such as PGMEA, alkylene glycol monoalkyl esters such as methyl cellosolve, butyl acetate, and 2-ethoxyethanol. Preferred solvents include ethyl lactate, propylene glycol methyl ether acetate, ethyl 3-ethoxypropionate and their mixtures. The above list of solvents is for illustrative purposes only and should not be viewed as being comprehensive nor should the choice of solvent be viewed as limiting the invention in any way. Those skilled in the art will recognize that any number of solvents or solvent mixtures may be used.

Greater than 50 percent of the total mass of the resist formulation is typically composed of the solvent, preferably greater than 80 percent.

Other customary additives include dyes that may be used to adjust the optical density of the formulated resist and sensitizers which enhance the activity of photoacid generators by absorbing radiation and transferring it to the photoacid generator. Examples include aromatics such as functionalized benzenes, pyridines, pyrimidines, biphenylenes, indenes, naphthalenes, anthracenes, coumarins, anthraquinones, other aromatic ketones, and derivatives and analogs of any of the foregoing.

A wide variety of compounds with varying basicity may be used as stabilizers and acid-diffusion controlling additives. They may include nitrogenous compounds such as aliphatic primary, secondary, and tertiary amines, cyclic amines such as piperidines, pyrimidines, morpholines, aromatic heterocycles such as pyridines, pyrimidines, purines, imines such as diazabicycloundecene, guanidines, imides, amides, and others. Ammonium salts may also be used, including ammonium, primary, secondary, tertiary, and quaternary alkyl- and arylammonium salts of alkoxides including hydroxide, phenolates, carboxylates, aryl and alkyl sulfonates, sulfonamides, and others. Other cationic nitrogenous compounds including pyridinium salts and salts of other heterocyclic nitrogenous compounds with anions such as alkoxides including hydroxide, phenolates, carboxylates, aryl and alkyl sulfonates, sulfonamides, and the like may also be employed. Surfactants may be used to improve coating uniformity, and include a wide variety of ionic and non-ionic, monomeric, oligomeric, and polymeric species. Likewise, a wide variety of anti-foaming agents may be employed to suppress coating defects. Adhesion promoters may be used as well; again, a wide variety of compounds may be employed to serve this function. A wide variety of monomeric, oligomeric, and polymeric plasticizers such as oligo- and polyethyleneglycol ethers, cycloaliphatic esters, and non-acid reactive steroidally derived materials may be used as plasticizers, if desired. However, neither the classes of compounds nor the specific compounds mentioned above are intended to be comprehensive and/or limiting. One versed in the art will recognize the wide spectrum of commercially available products that may be used to carry out the types of functions that these customary additives perform.

Typically, the sum of all customary additives will comprise less than 20 percent of the solids included in the resist formulation, preferably, less than 5 percent.

The resist compositions of the invention can be prepared by combining the oligosaccharide having the acid-cleavable —OR group, the radiation sensitive acid generator, and any other desired ingredients using conventional methods. The resist composition to be used in lithographic processes may have a significant amount of solvent.

The resist compositions of the invention are especially useful for lithographic processes used in the manufacture of integrated circuits on semiconductor substrates. The resist compositions are especially useful for lithographic processes using 193 nm or less (e.g., 157 nm) ultraviolet (UV) radiation. Where use of other radiation (e.g. x-ray or e-beam) is desired, the compositions of the invention can be adjusted (if necessary) by the addition of an appropriate dye or sensitizer to the composition. The use of the resist compositions of the present invention in lithography for patterning substrates (e.g., semiconductor substrates) is described next.

Lithographic applications generally involve transfer of a pattern to a layer of material on the substrate (e.g., semiconductor substrate, ceramic substrate, organic substrate, etc.). The material layer of the substrate may be a semiconductor layer (e.g., silicon, germanium, etc.), a conductor layer (e.g., copper), a dielectric layer (e.g., silicon dioxide), or other material layer depending on the stage of the manufacture process and the desired material set for the end product. In some applications, an antireflective coating (ARC) is applied over the material layer before application of the resist layer. The ARC layer may be any conventional ARC which is compatible with the molecular resists of the present invention.

The solvent-containing molecular resist composition may be applied to the desired substrate using, inter alia, spin coating or other technique. The substrate with the resist coating may be heated (i.e., pre-exposure baked) to remove the solvent and improve the coherence of the resist layer. The thickness of the applied layer may be thin, subject to the thickness being substantially uniform and the resist layer being of sufficient thickness to withstand subsequent processing (e.g., reactive ion etching) to transfer the lithographic pattern to the underlying substrate material layer. The pre-exposure bake step may be preferably conducted for about 10 seconds to 15 minutes, more preferably about 15 seconds to one minute.

After solvent removal, the resist layer is then patternwise-exposed to the desired radiation (e.g. 193 nm or 157 nm ultraviolet radiation). Where a scanning particle beam such as an electron beam is used, patternwise exposure may be achieved by scanning the beam across the substrate and selectively applying the beam in the desired pattern. Where wavelike (electromagnetic) radiation forms such as 193 nm or 157 nm ultraviolet radiation are used, the patternwise exposure may be conducted through a mask which is placed over the resist layer. The mask is patterned in order that first portions of the mask are transparent to the radiation and second portions of the mask are opaque to the radiation. Thus the radiation-exposed molecular resist coating on the substrate has an exposure pattern that reflects the patterning of the mask. For 193 nm UV radiation, the total exposure energy is preferably about 100 millijoules/cm$^2$ or less, and more preferably about 50 millijoules/cm$^2$ or less (e.g. 15-30 millijoules/cm$^2$).

After the desired patternwise exposure, the resist layer may be baked to further complete the acid-catalyzed reaction and to enhance the contrast of the exposed pattern. The post-exposure bake may be conducted at a temperature from about room temperature to about 110° C. The post-exposure bake may be conducted for a time from about 15 seconds to about 5 minutes.

After post-exposure bake, the resist structure with the desired pattern is obtained by contacting the resist layer with the aqueous alkaline developer solution which selectively dissolves the areas of the resist which were exposed to radiation. The resist compositions of the present invention can be developed for use with conventional 0.26N aqueous alkaline solutions. The resist compositions of the invention can also be developed using 0.14N or 0.21N or other aqueous alkaline solutions. Alternatively, the resist compositions of the present invention may be dissolved by developer consisting essentially of water. The resulting resist structure on the substrate may be dried to remove any remaining developer. The resist compositions of the present invention are generally characterized in that the product resist structures have high etch resistance. In some instances, it may be possible to further enhance the etch resistance of the resist structure by using a post-silylation technique using methods known in the art.

The pattern from the resist structure may then be transferred to the material (e.g., dielectric, conductor, or semiconductor) of the underlying substrate. The transfer may be achieved by reactive ion etching or some other etching technique (e.g., chemical etching). In the context of reactive ion etching, the etch resistance of the resist layer may be important. Thus, the compositions of the invention and resulting resist structures can be used to create patterned material layer structures such as metal wiring lines, holes for contacts or vias, insulation sections (e.g., damascene trenches or shallow trench isolation), trenches for capacitor structures, etc., as might be used in the design of integrated circuit devices.

The processes for making these (ceramic, conductor, or semiconductor) features generally involve providing a material layer or section of the substrate to be patterned, applying a layer of resist over the material layer or section, patternwise exposing the resist to radiation, developing the pattern by contacting the exposed resist with a solvent, etching the layer(s) underlying the resist layer at spaces in the pattern whereby a patterned material layer or substrate section is formed, and removing any remaining resist from the substrate. In some instances, a hard mask may be used below the resist layer to facilitate transfer of the pattern to a further underlying material layer or section. It should be understood that the invention is not limited to any specific lithography technique or device structure.

FIGS. 1-6 illustrate the use of photolithography with a molecular resist to pattern a substrate, in accordance with embodiments of the present invention.

FIG. 1 depicts a substrate 10 comprising a material layer 14 (to be patterned) and a remaining layer 12.

Figure 2:
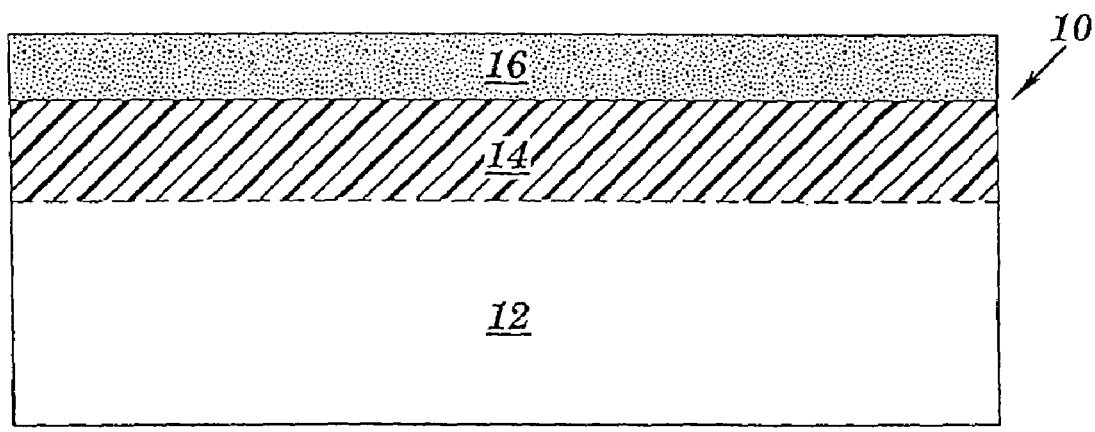

FIG. 2 depicts FIG. 1 after a molecular resist layer 16 has been formed on the material layer 14. The molecular resist layer 16 includes the molecular resist composition of the present invention, comprising an acid generator and the oligosaccharide having acid-cleavable —OR groups. The molecular resist composition is insoluble in an aqueous base developer solution or a developer consisting essentially of water, prior to being exposed to the imaging radiation discussed infra in conjunction with FIG. 3.

Figure 3:
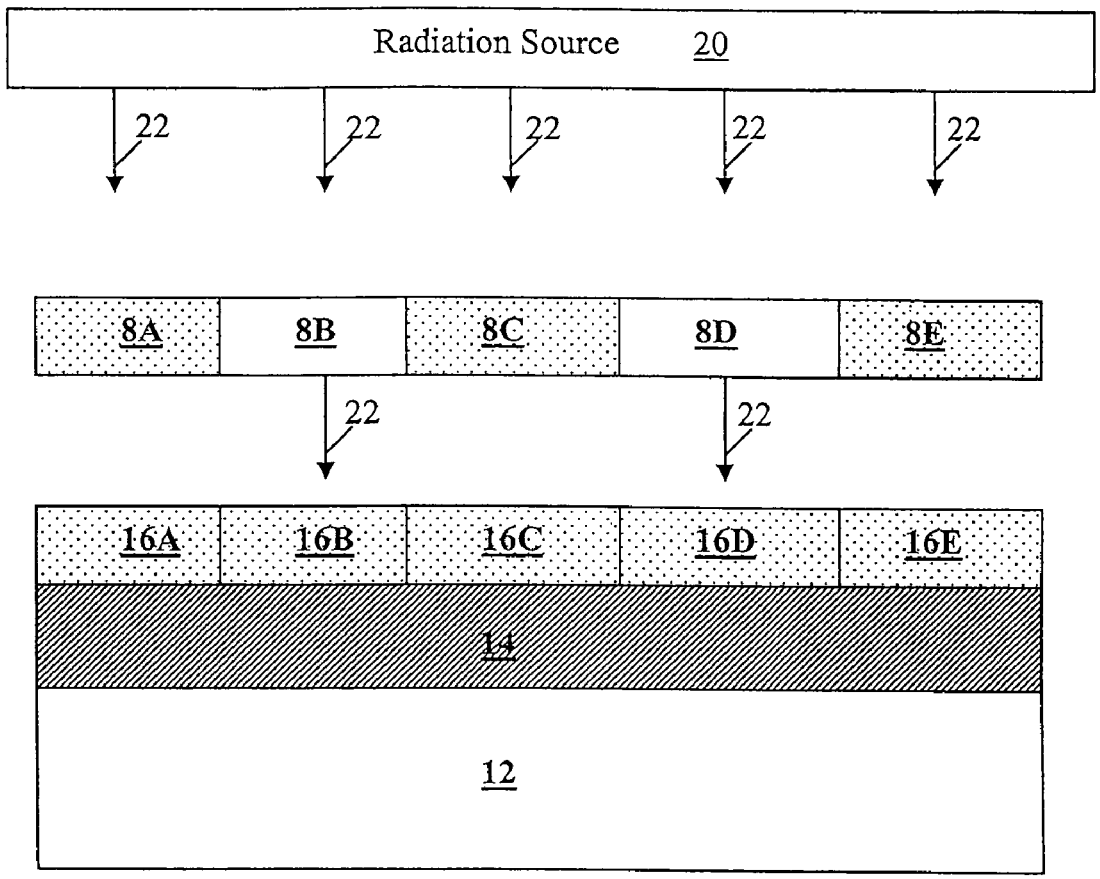

FIG. 3 depicts FIG. 2 with a radiation source 20 emitting imaging radiation 22 through transparent portions 8A, 8C, and 8E of a mask 8. The radiation 22 is characterized by a wavelength such as, inter alia, 193 nm or less (e.g., 157 nm). The radiation 22 does not pass through opaque portions 8A, 8C, and 8E of the mask 8. The radiation 22 transmitted through the transparent portions 8B, and 8D of the mask 8 strikes those portions 16B and 16D of the molecular resist layer 16 which are directly beneath said transparent portions of the mask 8. The radiation 22 causes the acid generator in portions 16B and 16D of the molecular resist layer 16 to generate acid, which in turn causes deprotection of the acid-cleavable —OR groups of the oligosaccharide in the molecular resist composition, thereby generating a reaction product that is soluble in the developer solution. Thus after exposure to the radiation 22, the exposed portions 16B and 16D of the molecular resist layer 16 are soluble in the developer solution, whereas the unexposed portions 16A, 16C, and 16E of the molecular resist layer 16 are insoluble in the developer solution.

Figure 4:
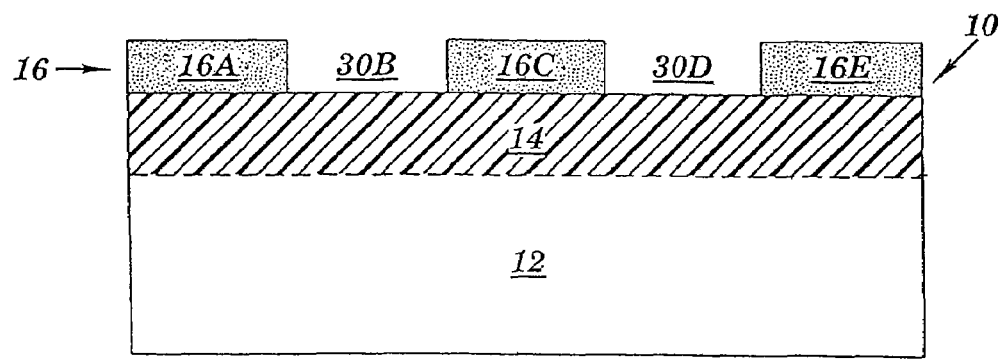

FIG. 4 depicts FIG. 3 after the developer solution been applied to the molecular resist layer 16 and has thus developed away the exposed portions 16B and 16D of the molecular resist layer 16 to generate voids 30B and 30D, respectively, in the molecular resist layer 16.

Figure 5:
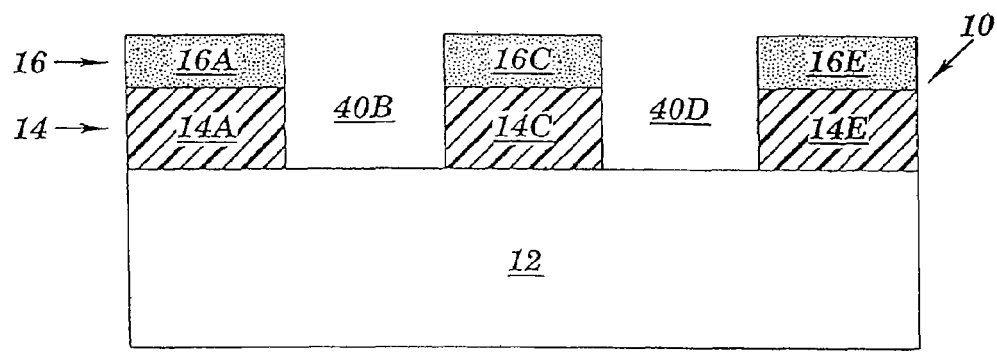

FIG. 5 depicts FIG. 4 after material layer 14 has been etched, such as by reactive ion etching or chemical etching, through the voids 30B and 30D to form blind vias 40B and 40D, respectively, in the material layer 14. The unetched portions 14A, 14C, and 14E of the material layer 14, together with the blind vias 40B and 40D in the material layer 14, form a pattern in the material layer 14. Said pattern in the material layer 14 reflects the pattern of transparent and opaque portions of the mask 8 of FIG. 3.

Figure 6:
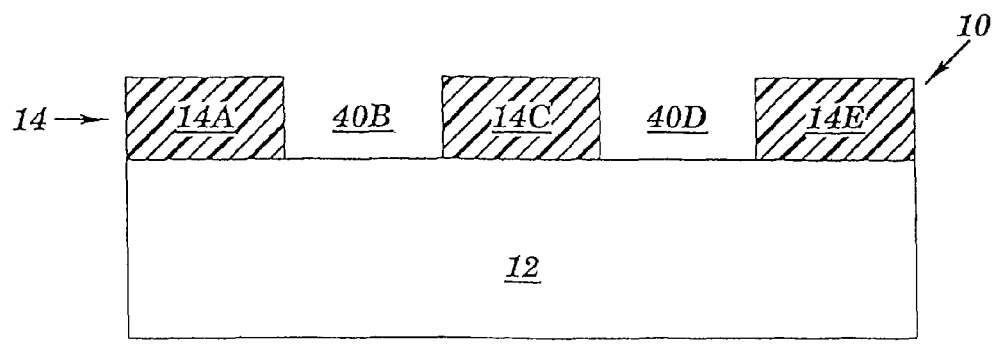

FIG. 6 depicts FIG. 5 after the molecular resist layer 16 has been removed.

EXAMPLE 1

Synthesis of β-Cyclodextrin Protected with α-Angelicalactone (Formula VII, wherein n=6 and wherein —OR=—OAL)

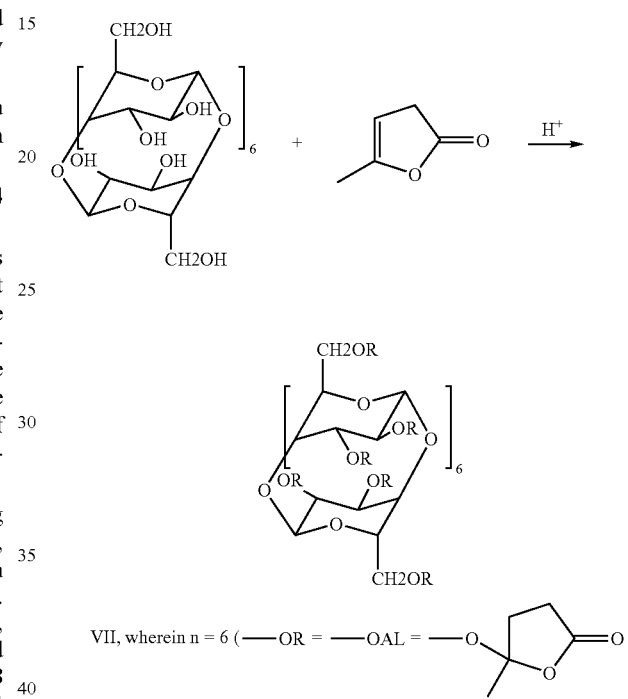

In Example 1, the molecular resist composition represented by Formula VII, wherein n=6 and wherein —OR=—OAL, of the present invention was synthesized. β-cyclodextrin hydrate (Aldrich) (6.6 g) was placed in a 100 ml round bottom flask equipped with a magnetic stir bar and heated at 120° degree C. for 24 hours in a vacuum oven. The anhydrous material obtained (5.75 g, 0.005 mole) was cooled to room temperature under nitrogen and α-angelicalactone (19.50 g, 0.200 mole) and 18 ml of anhydrous tetrahydrofuran (THF) were added. To this mixture, 200 mg of p-toluenesulfonic acid monohydrate was added and the mixture was heated to mild reflux under nitrogen with stirring. After 18 hours, the solution was cooled to room temperature and quenched with 0.2 ml of concentrated ammonium hydroxide. The solution was filtered through a frit filter funnel and added drop wise into a mixture of 500 ml of de-ionized water and 5 ml concentrated ammonium hydroxide solution. The precipitated material was filtered through a fine frit filter and dried under vacuum at 45° C. for 48 hours. Yield of the molecular resist composition represented by the Formula VII, wherein n=6 and wherein —OR=—OAL, was 4.4 grams. Complete replacement of OH by OR was indicated by an absence of absorption in the region 3000 to 3500 $cm^{-1}$ in the IR spectrum. The glass transition temperature (Tg) of the molecular resist composition VII, wherein n=6 and wherein —OR=—OAL, was 88° C.

EXAMPLE 2

Synthesis of D-Cellobiose Protected with α-Angelicalactone (Formula VIII), wherein m=2 and wherein —OR=—OAL)

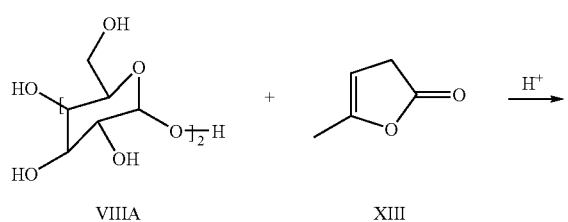

VIIIA    XIII wherein m = 2 and ( —OR = —O... =O = —OAL)

In Example 2, the molecular resist composition represented by Formula VIII, wherein m=2 and wherein —OR=—OAL, of the present invention was synthesized. D-Cellobiose, VIIIA (3.42 g, 0.01 mole), α-angelicalactone, XIII (15.70 g, 0.16 mole), and 30 ml anhydrous tetrahydrofuran (THF) were placed in 100 ml round bottom flask equipped with a magnetic stirbar. To this mixture, 150 mg of p-toluenesulfonic acid monohydrate was added and the mixture was heated to mild reflux under nitrogen with stirring. After 10 hours, the solution was cooled to room temperature and quenched with 0.2 ml concentrated ammonium hydroxide. This solution was filtered through a frit funnel and added drop wise into a mixture of 800 ml of de-ionized water and 8 ml concentrated ammonium hydroxide solution. The precipitated material was filtered through a fine frit filter and dried under vacuum at 45° C. for 18 hours. Yield of the molecular resist composition represented by Formula VIII, wherein m=2 and wherein —OR=—OAL, was 5.4 grams. The glass transition temperature (Tg) of the molecular resist composition represented by Formula VIII, wherein m=2 and wherein —OR=—OAL, was 85° C.

EXAMPLE 3

Synthesis of β-Cyclodextrin Protected with 3,4-Dihydro-2H-Pyran (Formula VII, wherein —OR=—OPyr)

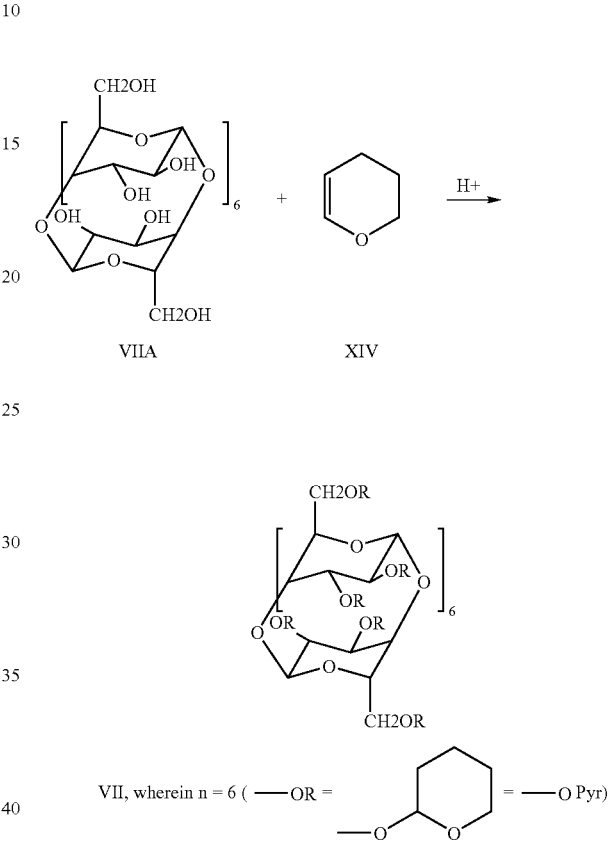

VII, wherein n = 6 ( —OR = ... = —O Pyr)

In Example 3, the substituted oligosaccharide represented by Formula VII, wherein n=6 and wherein —OR=—OPyr was synthesized. β-cyclodextrin hydrate, VIIA (Aldrich) (6.6 g) was placed in a 100 ml round bottom flask equipped with a magnetic stir bar and heated at 120° degree C. for 24 hours in a vacuum oven. The anhydrous material obtained (5.75 g, 0.005 mole) was cooled to room temperature under nitrogen and 3,4-Dihydro-2H-Pyran, XIV (17.66 g, 0.210 mole) and 19 ml of dichloromethane were added. To this mixture, 200 mg of pyridinium p-toluenesulfonate was added and the mixture was heated to mild reflux under nitrogen with stirring. After 24 hours, the solution was cooled to room temperature and diluted with 30 ml dichloromethane. The solution was washed with 2×100 ml deionized water and 1×100 ml brine and dried over anhydrous magnesium sulfate. The solution was filtered and the solvent was removed in a rotary evaporator at 30° C. The white solid was then dried under high vacuum at room temperature for 24 hours. The yield of the substituted oligosaccharide represented by Formula VII, wherein n=6 and wherein —OR=—OPyr, was 9.2 grams. The glass transition temperature (Tg) of the substituted oligosaccharide, represented by Formula VII, wherein n=6 and wherein —OR=—OPyr, was =55° C.

EXAMPLE 4

Preparation of a Solution of the Resist Formulation and a Photo Acid Generator in a Casting Solvent (Formula XVI)

In Example 4, the substituted oligosaccharide, represented by Formula VII, wherein n=6 and wherein —OR=—OAL (1.0 grams), and a sulfonium Photo Acid Generator (PAG) (40 mg) were dissolved in propylene glycol monomethyl ether acetate (PGMEA, 6 grams). The solution, including the substituted oligosaccharide, represented by Formula VII, wherein n=6 and wherein —OR=—OAL, and the sulfonium Photo Acid Generator (PAG) in PGMEA was filtered through a 0.2 μm filter, resulting in the solution of the substituted oligosaccharide and the Photo Acid Generator in PGMEA (Formula XVI) of the present invention.

EXAMPLE 5

Lithographic Evaluation Using 193 nm Exposure Tool, Using 0.263 N TMAH Developer Solution for 60 Seconds For the purpose of evaluative lithographic experiments at 193 nm, the molecular resist formulation containing the substituted oligosaccharide, represented by Formula VII, wherein n=6 and wherein —OR=—OAL, and the sulfonium Photo Acid Generator (PAG) in PGMEA Formula XVI of Example 4, was prepared by combining the materials set forth below, expressed in terms of weight percent.

| | |
|---|---|
| Propylene Glycol Monomethyl Ether Acetate, PGMEA | 85.23 |
| β-Cyclodextrin Protected with α-Angelicalactone | 14.20 |
| t-butyl diphenylsulfonium perfluorobutanesulfonate | 0.57 |

In the preceding list of materials, the PGMEA is the solvent, the β-Cyclodextrin protected with α-angelicalactone (Formula VII, wherein n=6 and wherein —OR=—OAL) is the substituted oligosaccharide, and the t-butyl diphenylsulfonium perfluorobutanesulfonate is the acid generator.

A silicon substrate was coated with 2000 Å of the positive resist composition (Example 4 above). The molecular resist layer was soft-baked at 120° C. for 60 seconds on a vacuum hot plate to produce a film thickness of about 0.2 μm. The wafers were then exposed to 193 nm radiation (ASML scanner, 0.60 NA). The exposure pattern was an array of lines and spaces of varying dimensions with the smallest dimension being 0.09 μm. The exposed wafers were post-exposure baked on a vacuum hot plate at 70-90° C. for 60 seconds. The wafers were then puddle developed using 0.263 N TMAH developer solution for 60 seconds. The resulting patterns of the molecular resist imaging layer were then examined by scanning electron microscopy (SEM). Developed images have a line spacing no greater than 120 nm using 0.263 N TMAH developer solution for 60 seconds.

EXAMPLE 6

Lithographic Evaluation Using 193 Nm Exposure Tool, Using Developer Solution Consisting Essentially of Water The same procedure was used as set forth in Example 5, described supra, except that developer consisting essentially of water was used as the developer instead of 0.263 N TMAH. The resulting patterns of the molecular resist imaging layer were then examined by scanning electron microscopy (SEM). Developed images have a line spacing no greater than 120 nm when the developer consists essentially of water.

While the invention has been particularly shown and described with reference to preferred exemplary embodiments thereof, it will be understood by those skilled in the art that the foregoing and other changes in form and details may be made therein without departing from the spirit and scope of the invention.

We claim:

1. A resist composition comprising:
a substituted oligosaccharide, wherein the substituted oligosaceharide is substituted with at least one acid-cleavable —OR group and the substituted oligosaccharide has 2 to 10 monosaccharides, wherein:
each monosaccharide in the substituted oligosaccharide has at least three carbon atoms;
the monosaccharides are joined by glycosidic linkages; and
at least one remaining hydroxyl group from a monosaccharide of said substituted oligosaccharide has been replaced by a protective group having the acid-cleavable —OR group, wherein said acid-cleavable —OR group is selected from the following structures:

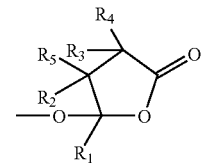

I

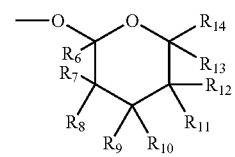

II

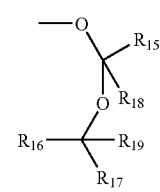

III

-continued

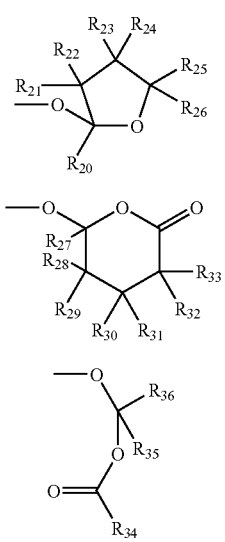

wherein $R_1$-$R_{14}$, $R_{16}$-$R_{17}$, and $R_{19}$-$R_{35}$ are each independently selected from the group consisting of hydrogen, a linear alkyl group having 1-6 carbon atoms, a branched alkyl group having 2-12 carbon atoms, a cycloalkyl group having 3-17 carbon atoms, a fluorinated linear alkyl group having 2-12 carbon atoms, a fluorinated branched alkyl group having 2-12 carbon atoms, and a fluorinated cycloalkyl group having 3-17 carbon atoms, wherein $R_{15}$, $R_{18}$, and $R_{36}$ are each independently selected from the group consisting of a linear alkyl group having 1-6 carbon atoms, a branched alkyl group having 2-12 carbon atoms, a cycloalkyl group having 3-17 carbon atoms, a fluorinated linear alkyl group having 2-12 carbon atoms, a fluorinated branched alkyl group having 2-12 carbon atoms, and a fluorinated cycloalkyl group having 3-17 carbon atoms, and wherein any two of $R_1$-$R_{36}$ that are in the same molecule may be linked to form a three- to eight-membered cyclic group.

2. The resist composition of claim 1, wherein said acid-cleavable -OR group is

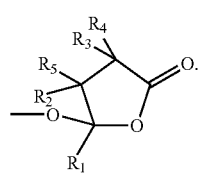

3. A method of patterning a substrate, comprising:
forming a resist layer over and in contact with a material layer of the substrate, said resist layer comprising a positive photoresist composition that includes the resist composition of claim 2 and a radiation sensitive acid generator;
selectively exposing a first portion of the resist layer to imaging radiation such that a remaining portion of the resist layer is not exposed to the imaging radiation, resulting in the acid generator facilitating removal of the acid-cleavable -OR group to generate a reaction product in the first portion of the resist layer;
developing away the first portion of the resist layer by contacting the resist layer with a developer solution in which the remaining portion of the resist layer is insoluble, resulting in formation of a pattern of voids in the resist layer;
forming a pattern of voids in the material layer by etching into the material layer through the pattern of voids in the resist layer; and
after said forming the pattern of voids in the material layer, removing the resist layer.

4. The resist compositioin of claim 1, wherein said acid-cleavable -OR group is

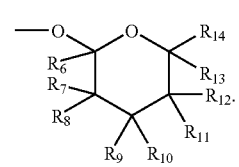

5. A method of patterning a substrate, comprising:
forming a resist layer over and in contact with a material layer of the substrate, said resist layer comprising a positive photoresist composition that includes the resist composition of claim 4 and a radiation sensitive acid generator;
selectively exposing a first portion of the resist layer to imaging radiation such that a remaining portion of the resist layer is not exposed to the imaging radiation, resulting in the acid generator facilitating removal of the acid-cleavable -OR group to generate a reaction product in the first portion of the resist layer;
developing away the first portion of the resist layer by contacting the resist layer with a developer solution in which the remaining portion of the resist layer is insoluble, resulting in formation of a pattern of voids in the resist layer;
forming a pattern of voids in the material layer by etching into the material layer through the pattern of voids in the resist layer; and
after said forming the pattern of voids in the material layer, removing the resist layer.

6. The resist composition of claim 1, wherein said acid-cleavable -OR group is

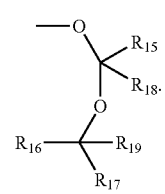

7. A method of patterning a substrate, comprising:
forming a resist layer over and in contact with a material layer of the substrate, said resist layer comprising a positive photoresist composition that includes the resist composition of claim 6 and a radiation sensitive acid generator;
selectively exposing a first portion of the resist layer to imaging radiation such that a remaining portion of the resist layer is not exposed to the imaging radiation, resulting in the acid generator facilitating removal of the acid-cleavable -OR group to generate a reaction product in the first portion of the resist layer;

developing away the first portion of the resist layer by contacting the resist layer with a developer solution in which the remaining portion of the resist layer is insoluble, resulting in formation of a pattern of voids in the resist layer;

forming a pattern of voids in the material layer by etching into the material layer through the pattern of voids in the resist layer; and after said forming the pattern of voids in the material layer, removing the resist layer.

8. The resist composition of claim 1, wherein said acid-cleavable -OR group is

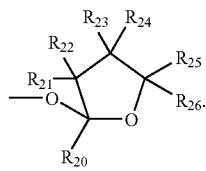

IV

9. A method of patterning a substrate, comprising:

forming a resist layer over and in contact with a material layer of the substrate, said resist layer comprising a positive photoresist composition that includes the resist composition of claim 8 and a radiation sensitive acid generator;

selectively exposing a first portion of the resist layer to imaging radiation such that a remaining portion of the resist layer is not exposed to the imaging radiation, resulting in the acid generator facilitating removal of the acid-cleavable -OR group to generate a reaction product in the first portion of the resist layer;

developing away the first portion of the resist layer by contacting the resist layer with a developer solution in which the remaining portion of the resist layer is insoluble, resulting in formation of a pattern of voids in the resist layer;

forming a pattern of voids in the material layer by etching into the material layer through the pattern of voids in the resist layer; and after said forming the pattern of voids in the material layer, removing the resist layer.

10. The resist composition of claim 1, wherein said acid-cleavable -OR group is

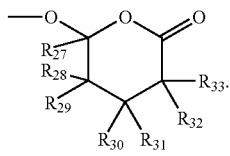

V

11. A method of patterning a substrate, comprising:

forming a resist layer over and in contact with a material layer of the substrate, said resist layer comprising a positive photoresist composition that includes the resist composition of claim 10 and a radiation sensitive acid generator;

selectively exposing a first portion of the resist layer to imaging radiation such that a remaining portion of the resist layer is not exposed to the imaging radiation, resulting in the acid generator facilitating removal of the acid-cleavable -OR group to generate a reaction product in the first portion of the resist layer;

developing away the first portion of the resist layer by contacting the resist layer with a developer solution in which the remaining portion of the resist layer is insoluble, resulting in formation of a pattern of voids in the resist layer;

forming a pattern of voids in the material layer by etching into the material layer through the pattern of voids in the resist layer; and after said forming the pattern of voids in the material layer, removing the resist layer.

12. The resist composition of claim 1, wherein said acid-cleavable -OR group is

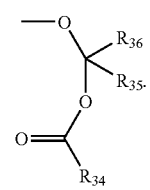

VI

13. A method of patterning a substrate, comprising:

forming a resist layer over and in contact with a material layer of the substrate, said resist layer comprising a positive photoresist composition that includes the resist composition of claim 12 and a radiation sensitive acid generator;

selectively exposing a first portion of the resist layer to imaging radiation such that a remaining portion of the resist layer is not exposed to the imaging radiation, resulting in the acid generator facilitating removal of the acid-cleavable -OR group to generate a reaction product in the first portion of the resist layer;

developing away the first portion of the resist layer by contacting the resist layer with a developer solution in which the remaining portion of the resist layer is insoluble, resulting in formation of a pattern of voids in the resist layer;

forming a pattern of voids in the material layer by etching into the material layer through the pattern of voids in the resist layer; and after said forming the pattern of voids in the material layer, removing the resist layer.

14. A method of patterning a substrate, comprising:

forming a resist layer over and in contact with a material layer of the substrate, said resist layer comprising a positive photoresist composition that includes the resist composition of claim 1 and a radiation sensitive acid generator;

selectively exposing a first portion of the resist layer to imaging radiation such that a remaining portion of the resist layer is not exposed to the imaging radiation, resulting in the acid generator facilitating removal of the acid-cleavable -OR group to generate a reaction product in the first portion of the resist layer;

developing away the first portion of the resist layer by contacting the resist layer with a developer solution in which the remaining portion of the resist layer is insoluble, resulting in formation of a pattern of voids in the resist layer;

forming a pattern of voids in the material layer by etching into the material layer through the pattern of voids in the resist layer; and after said forming the pattern of voids in the material layer, removing the resist layer.

15. A resist composition comprising:

a substituted oligosaccharide, wherein the substituted oligosaccharide is substituted with at least one acid-cleavable —OR group and the substituted oligosaccharide has 2 to 10 monosaccharides, wherein:

each monosaccharide in the substituted oligosaccharide has at least three carbon atoms;

the monosaccharides are joined by glycosidic linkages; and at least one remaining hydroxyl group from a monosaccharide of said substituted oligosaccharide has been replaced by a protective group having the acid-cleavable —OR group selected from the group consisting of ester, —OXC(O)OR$_{37}$, ether, —OR$_{38}$, carbonate, —OC(O)OR$_{39}$, cyclic acetal, —O—C(OR$_{40}$)R$_{41}$H, ketal, —O—C(OR$_{42}$)R$_{43}$R$_{44}$, orthoester, —OC(OR$_{45}$)(OR$_{46}$)R$_{47}$, and combinations thereof, wherein X is a linking group consisting of branched alkylene having 2 to 7 carbon atoms, cycloalkylene having 3 to 17 carbon atoms, alkylcycloalkylene having 4 to 20 carbon atoms, a cycloalkylalkylene having 4 to 20 carbon atoms, and combinations thereof, wherein each R$_{37}$-R$_{39}$ is selected from the group consisting of hydrocarbyl substituents with a tertiary carbon attachment point, wherein R$_{39}$ is not a t-butyl group, and wherein each of R$_{40}$-R$_{47}$, is independently selected from the group of hydrocarbyl substituents with a primary, secondary or tertiary carbon attachment point consisting of a linear alkyl group having 1-6 carbon atoms, a branched alkyl group having 2-12 carbon atoms, a cycloalkyl group having 3-17 carbon atoms, a fluorinated linear alkyl group having 2-12 carbon atoms, a fluorinated branched alkyl group having 2-12 carbon atoms, and a fluorinated cycloalkyl group having 3-17 carbon atoms, aryl groups, aralkyl groups, alkaryl groups, cycloalkyl groups, bicycloalkyl groups, alkenyl groups, alkalkenyl groups, and alkenylalkyl groups, alkynyl groups, alkalkynyl groups, alkynylalkyl groups, trifluoropropyl groups, cyanopropyl groups, acryloyl groups, arylacryloyl groups, acryloylaryl groups, alkylacyl groups, arylacyl groups alkylenylacyl groups and alkynylacyl groups, wherein R$_{47}$ may be a hydrogen atom, and wherein any two of R$_{40}$-R$_{47}$ in the same molecule may be linked to form a three- to eight-membered cyclic group, wherein the monosaccharides are each selected from the group consisting of pentoses, hexoses and combinations thereof.

16. A method of patterning a substrate, comprising:

forming a resist layer over and in contact with a material layer of the substrate, said resist layer comprising a positive photoresist composition that includes the resist composition of claim 15 and a radiation sensitive acid generator;

selectively exposing a first portion of the resist layer to imaging radiation such that a remaining portion of the resist layer is not exposed to the imaging radiation, resulting in the acid generator facilitating removal of the acid-cleavable -OR group to generate a reaction product in the first portion of the resist layer;

developing away the first portion of the resist layer by contacting the resist layer with a developer solution in which the remaining portion of the resist layer is insoluble, resulting in formation of a pattern of voids in the resist layer;

forming a pattern of voids in the material layer by etching into the material layer through the pattern of voids in the resist layer; and after said forming the pattern of voids in the material layer, removing the resist layer.

17. A resist composition comprising:

a substituted oligosaccharide, wherein the substituted oligosaccharide is substituted with at least one acid-cleavable —OR group and the substituted oligosaccharide has 2 to 10 monosaccharides, wherein:

each monosaccharide in the substituted oligosaccharide has at least three carbon atoms;

the monosaccharides are joined by glycosidic linkages; and at least one remaining hydroxyl group from a monosaccharide of said substituted oligosaccharide has been replaced by a protective group having the acid-cleavable —OR group selected from the group consisting of —OXC(O)OR$_{37}$, ether, carbonate, —OC(O)OR$_{39}$, cyclic acetal, —O—C(OR$_{40}$)R$_{41}$H, ketal, —O—C(OR$_{42}$)R$_{43}$R$_{44}$, orthoester, —OC(OR$_{45}$)(OR$_{46}$)R$_{47}$, and combinations thereof, wherein X is a linking group consisting of branched alkylene having 2 to 7 carbon atoms, cycloalkylene having 3 to 17 carbon atoms, alkylcycloalkylene having 4 to 20 carbon atoms, a cycloalkylalkylene having 4 to 20 carbon atoms, and combinations thereof, wherein R$_{37}$ and R$_{39}$ are selected from the group consisting of hydrocarbyl sub stituents with a tertiary carbon attachment point, wherein R$_{39}$ is not a t-butyl group, and wherein each of R$_{40}$-R$_{47}$ is independently selected from the group of hydrocarbyl substituents with a primary, secondary or tertiary carbon attachment point consisting of a linear alkyl group having 1-6 carbon atoms, a branched alkyl group having 2-12 carbon atoms, a cycloalkyl group having 3-17 carbon atoms, a fluorinated linear alkyl group having 2-12 carbon atoms, a fluorinated branched alkyl group having 2-12 carbon atoms, and a fluorinated cycloalkyl group having 3-17 carbon atoms, aryl groups, aralkyl groups, alkaryl groups, cycloalkyl groups, bicycloalkyl groups, alkenyl groups, alkalkenyl groups, and alkenylalkyl groups, alkynyl groups, alkalkynyl groups, alkynylalkyl groups, trifluoropropyl groups, cyanopropyl groups, acryloyl groups, arylacryloyl groups, acryloylaryl groups, alkylacyl groups, arylacyl groups alkylenylacyl groups and alkynylacyl groups, and furthermore wherein R$_{47}$ may be a hydrogen atom, wherein any two of R$_{40}$-R$_{47}$ in the same molecule may be linked to form a three- to eight-membered cyclic group, and wherein the substituted oligosaccharide is represented by the following cyclic formula, and wherein n is a positive integer from 2 to 9:

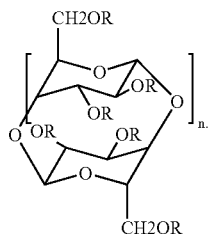

VII

18. The resist composition of claim 17, wherein n is a positive integer from 5 to 7.

19. A method of patterning a substrate, comprising:
forming a resist layer over and in contact with a material layer of the substrate, said resist layer comprising a positive photoresist composition that includes the resist composition of claim 17 and a radiation sensitive acid generator;
selectively exposing a first portion of the resist layer to imaging radiation such that a remaining portion of the resist layer is not exposed to the imaging radiation, resulting in the acid generator facilitating removal of the acid-cleavable -OR group to generate a reaction product in the first portion of the resist layer;
developing away the first portion of the resist layer by contacting the resist layer with a developer solution in which the remaining portion of the resist layer is insoluble, resulting in formation of a pattern of voids in the resist layer;
forming a pattern of voids in the material layer by etching into the material layer through the pattern of voids in the resist layer; and
after said forming the pattern of voids in the material layer, removing the resist layer.

20. A resist composition comprising:
a substituted oligosaccharide, wherein the substituted oligosaccharide is substituted with at least one acid-cleavable —OR group and the substituted oligosaccharide has 2 to 10 monosaccharides, wherein:
each monosaccharide in the substituted oligosaccharide has at least three carbon atoms;
the monosaccharides are joined by glycosidic linkages; and
at least one remaining hydroxyl group from a monosaccharide of said substituted oligosaccharide has been replaced by a protective group having the acid-cleavable —OR group, wherein said at least one acid-cleavable —OR group includes at least one of the following structures:

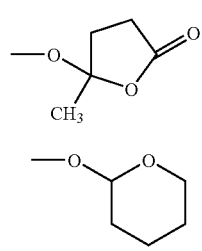

IX

X

21. The resist composition of claim 20, wherein said at least one acid-cleavable -OR group includes

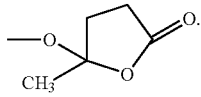

IX

22. A method of patterning a substrate, comprising:
forming a resist layer over and in contact with a material layer of the substrate, said resist layer comprising a positive photoresist composition that includes the resist composition of claim 21 and a radiation sensitive acid generator;
selectively exposing a first portion of the resist layer to imaging radiation such that a remaining portion of the resist layer is not exposed to the imaging radiation, resulting in the acid generator facilitating removal of the acid-cleavable -OR group to generate a reaction product in the first portion of the resist layer;
developing away the first portion of the resist layer by contacting the resist layer with a developer solution in which the remaining portion of the resist layer is insoluble, resulting in formation of a pattern of voids in the resist layer;
forming a pattern of voids in the material layer by etching into the material layer through the pattern of voids in the resist layer; and
after said forming the pattern of voids in the material layer, removing the resist layer.

23. The resist composition of claim 20, wherein said at least one acid-cleavable -OR group includes

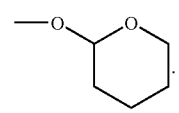

X

24. A method of patterning a substrate, comprising:
forming a resist layer over and in contact with a material layer of the substrate, said resist layer comprising a positive photoresist composition that includes the resist composition of claim 23 and a radiation sensitive acid generator;
selectively exposing a first portion of the resist layer to imaging radiation such that a remaining portion of the resist layer is not exposed to the imaging radiation, resulting in the acid generator facilitating removal of the acid-cleavable -OR group to generate a reaction product in the first portion of the resist layer;
developing away the first portion of the resist layer by contacting the resist layer with a developer solution in which the remaining portion of the resist layer is insoluble, resulting in formation of a pattern of voids in the resist layer;
forming a pattern of voids in the material layer by etching into the material layer through the pattern of voids in the resist layer; and
after said forming the pattern of voids in the material layer, removing the resist layer.

25. A method of patterning a substrate, comprising:
forming a resist layer over and in contact with a material layer of the substrate, said resist layer comprising a positive photoresist composition that includes the resist composition of claim 20 and a radiation sensitive acid generator;

selectively exposing a first portion of the resist layer to imaging radiation such that a remaining portion of the resist layer is not exposed to the imaging radiation, resulting in the acid generator facilitating removal of the acid-cleavable -OR group to generate a reaction product in the first portion of the resist layer;

developing away the first portion of the resist layer by contacting the resist layer with a developer solution in which the remaining portion of the resist layer is insoluble, resulting in formation of a pattern of voids in the resist layer;

forming a pattern of voids in the material layer by etching into the material layer through the pattern of voids in the resist layer; and after said forming the pattern of voids in the material layer, removing the resist layer.

* * * * *